United States Patent
Furudate et al.

(10) Patent No.: US 6,862,672 B1
(45) Date of Patent: Mar. 1, 2005

(54) SEMICONDUCTOR MEMORY DEVICE AND METHOD OF CONTROLLING SAME

(75) Inventors: Tomomi Furudate, Kawasaki (JP); Takaaki Ichikawa, Kawasaki (JP); Junya Kawamata, Kawasaki (JP); Hideyuki Furukawa, Kawasaki (JP); Haruo Shoji, Kawasaki (JP); Yuzuru Matsuno, Kawasaki (JP); Tatsuya Yoshimoto, Kawasaki (JP); Masato Kitamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 683 days.

(21) Appl. No.: 09/583,233

(22) Filed: May 31, 2000

(30) Foreign Application Priority Data

Dec. 20, 1999 (JP) .......................................... 11-360579

(51) Int. Cl.[7] .............................................. G06F 12/00
(52) U.S. Cl. ................... 711/163; 711/152; 365/230.08
(58) Field of Search ................................ 711/100, 202, 711/203, 152, 163; 365/230.08, 201

(56) References Cited

U.S. PATENT DOCUMENTS 5,398,212 A * 3/1995 Imura et al. ........... 365/230.08
5,754,816 A * 5/1998 Howard ...................... 711/203

FOREIGN PATENT DOCUMENTS

JP 07-078466 3/1995

\* cited by examiner

Primary Examiner—Mano Padmanabhan
Assistant Examiner—Thang Ho
(74) Attorney, Agent, or Firm—Arent Fox, PLLC

(57) ABSTRACT

A plurality of memory cells corresponding to an address space larger than $2^n$ and smaller than $2^{(n+1)}$, an invalid address detecting circuit, and an invalid signal outputting circuit are comprised. Upon command input, the invalid address detecting circuit invalidates a command in the case where the invalid address detecting circuit detects a fact that an address signal supplied from exterior indicates an invalid address space. Therefore, at the time of invalid address supply, internal circuits are not activated and an erroneous write or erase operation can be prevented. Since the internal circuits do not operate, power consumption can be reduced substantially. The invalid signal outputting circuit outputs an invalid signal by receiving the fact of invalid address signal detection by the invalid address detecting circuit. Therefore, a system unit mounting the semiconductor memory device can easily recognize that the invalid address signal has been supplied to the semiconductor memory device. As a result, a malfunctioning can be prevented and reliability of the system unit improves.

7 Claims, 8 Drawing Sheets

SEMICONDUCTOR MEMORY DEVICE AND METHOD OF CONTROLLING SAME

BACKGROUND OF THE INVENTION

1. Field of the Invention

The present invention relates to a semiconductor memory device. More specifically, the present invention relates to a semiconductor memory device having an address space larger than $2^n$ and smaller than $2^{(n+1)}$ and to a method of controlling the semiconductor memory device.

2. Description of the Related Art

Semiconductor memory devices such as flash memories, SRAMs or DRAMS each generally have an address space of $2^n$ and a plurality of memory cells corresponding to the address space. For example, a 64M-bit flash memory comprising 16 input/output terminals (I/O=16 bit) receives address signals by 22 address terminals and controls an address space of 4M bits. By using an address space of $2^n$, reading and writing is carried out on the memory cells corresponding to all addresses supplied to the semiconductor memory device.

Meanwhile, with semiconductor structures becoming finer, memory capacities of semiconductor memory devices are increasing. As a result, the memory capacity of a semiconductor memory device mounted in a system unit sometimes becomes larger than the memory capacity actually used. In other words, a useless address space exists in the semiconductor memory device mounted on the system unit. In such a situation, a semiconductor memory device having an address space whose size is not $2^n$, where n is a positive integer, has been demanded.

For example, in the case of a semiconductor memory device having a 3M-bit address space, 22 address terminals corresponding to a 4M-bit address space are necessary. As a result, a portion of address signals indicates an invalid address not corresponding to memory cells. When an invalid address is supplied to the semiconductor memory device, error data may be output in a read operation and may be written in a memory cell in a write operation.

In Japanese Patent Application Laid-Open Publication No. Hei 7-78466, a detecting circuit for detecting a fact of invalid address signal supply is used, and a control signal for suppressing data output is generated when the fact is detected.

However, the invalid address described above is not intentionally output by the system unit mounting the semiconductor memory device, but often generated by power supply noise or an erroneous program. In this case, the system unit cannot recognize the fact that the invalid address has been supplied to the semiconductor memory device. For example, in a read operation, although the semiconductor memory device receives an invalid address and causes an input/output terminal to have high impedance, the system unit receives the level of the high-impedance state (H level in the case where a data bus is pulled up on the system) as normal data. In other words, the system unit does not operate properly only by detecting the invalid address and suppressing the data output. In order to operate normally, the system unit needs to detect the supply of the invalid address to the semiconductor memory device.

Furthermore, in the case where an invalid address is supplied to the semiconductor memory device in a write operation, data are not written in a proper address intended by the system unit. As a result, in a read operation thereafter, the system unit cannot read the data which should have been written.

SUMMARY OF THE INVENTION

An object of the present invention is to prevent a malfunctioning of a system unit mounting a semiconductor memory device by transmitting to the system unit the information that the semiconductor memory device has received an invalid address signal.

Another object of the present invention is to invalidate an operation cycle in the case where an invalid address signal has been received during the cycle.

Still another object of the present invention is to prevent wasteful power consumption on receipt of an invalid address signal.

According to one of the aspects of the semiconductor memory device in the present invention, the semiconductor memory device has a plurality of memory cells corresponding to an address space larger than $2^n$ and smaller than $2^{(n+1)}$, an invalid address detecting circuit, and an invalid signal outputting circuit. The invalid address detecting circuit detects that an address signal supplied from the exterior does not correspond to the address space. The invalid signal outputting circuit outputs an invalid signal to the exterior in accordance to the invalid address being detected by the invalid address detecting circuit.

Therefore, a system unit mounting the semiconductor memory device can easily recognize that the invalid address signal has been supplied to the semiconductor memory device. As a result, malfunctioning is prevented and reliability of the system unit improves.

According to another aspect of the semiconductor memory device in the present invention, the semiconductor memory device comprises an output controlling circuit. When an invalid address signal is detected by the invalid address signal detecting circuit in a read operation, the output controlling circuit controls output of a data signal having been read in an immediately preceding the read operation. By maintaining the signal level of a data terminal at the time an invalid address signal is supplied, power consumption can be reduced.

According to another aspect of the semiconductor memory device in the present invention, the semiconductor memory device comprises an output circuit for receiving a read data signal from one of the memory cells and for outputting the received signal to the exterior. In a read operation, the output circuit is controlled by the output controlling circuit at the time the invalid address signal supplied by the invalid address detecting circuit is detected, and continuously outputs the received data. Therefore, by applying the present invention to flash memories, EPROMs, or the like carrying out read operations continuously, the power consumption can be further reduced.

According to another of the aspects of the semiconductor memory device in the present invention, the semiconductor memory device comprises the output controlling circuit for giving high impedance to a data terminal at the time the invalid address signal supplied by the invalid address detecting circuit is detected. In the case where an invalid address signal is supplied, the data input/output terminal comes to have high impedance, which leads to reduced power consumption.

According to another of the aspects of the semiconductor memory device in the present invention, the semiconductor memory device comprises a plurality of memory cells corresponding to an address space larger than $2^n$ and smaller than $2^{(n+1)}$, an invalid address signal detecting circuit, and an output controlling circuit. The invalid address detecting circuit detects that an address signal supplied from the exterior indicates an address space other then the address space. The output controlling circuit carries out a control of continuously outputting a data signal read in a read operation cycle immediately preceding a read operation cycle in which the invalid address signal has been detected by the invalid address detecting circuit. By retaining a signal level of a data terminal at the time the invalid address signal is supplied, power consumption is reduced.

According to another of the aspects of the semiconductor memory device in the present invention, the semiconductor memory device comprises an output circuit for receiving a read data signal from one of the memory cells and for outputting the received signal to the exterior. In the case where an invalid address signal has been detected by the invalid address detecting circuit in a read operation, the output circuit continuously outputs the received data, according to a control by the output controlling circuit. A system unit mounting this semiconductor memory device can recognize that an invalid address signal has been supplied to the semiconductor memory device, by not detecting any change in the data signal having been read continuously. In other words, malfunctioning is prevented and reliability of the system unit improves.

According to another aspect of the semiconductor memory device in the present invention, the semiconductor memory device comprises a plurality of nonvolatile memory cells corresponding to an address space larger than $2^n$ and smaller than $2^{(n+1)}$, a command controlling circuit, and an invalid address detecting circuit. The command controlling circuit automatically performs a write or an erase operation in the memory cells, in response to a command input from the exterior. The invalid address detecting circuit detects that an address signal supplied as the command input indicates an address other than the address space. The command input is invalidated at the time of detection of the invalid address signal supply detected by the invalid address detecting circuit. For this reason, an internal circuit is not activated in the case where the invalid address signal has been supplied, and an erroneous write or erase operation can be prevented. Furthermore, power consumption can be reduced, since the internal circuit does not operate.

According to another aspect of the semiconductor memory device in the present invention, the semiconductor memory device comprises an invalid signal outputting circuit for outputting an invalid signal to the exterior at the time the invalid address signal supplied by the invalid address detecting circuit is detected. Therefore, a system unit mounting the semiconductor memory device can easily recognize that the invalid address signal is supplied to the semiconductor memory device. As a result, malfunctioning is prevented and reliability of the system unit improves.

According to one of the aspects of the semiconductor memory device controlling method in the present invention, an invalid signal is output to the exterior when an address signal supplied from exterior indicating an address other than an address space is detected. Therefore, a system unit mounting a semiconductor memory device comprising a plurality of memory cells corresponding to an address space larger than $2^n$ and smaller than $2^{(n+1)}$, where n is a positive integer, can easily recognize that the invalid address signal has been supplied to the semiconductor memory device. As a result, malfunctioning is prevented and reliability of the system unit improves.

According to another of the aspects of the semiconductor memory device controlling method in the present invention, in the case where an address signal supplied from exterior indicating an address other than an address space is detected at the time of command input, the command input is invalidated. Therefore, in a semiconductor memory device comprising a plurality of memory cells corresponding to an address space larger than $2^n$ and smaller than $2^{(n+1)}$, where n is a positive integer, an internal circuit is not activated at the time the invalid address is supplied, and an erroneous write or erase operation can be prevented. Furthermore, since the internal circuit does not operate, power consumption is substantially reduced.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be explained with reference to the accompanying drawings.

Figure 1:
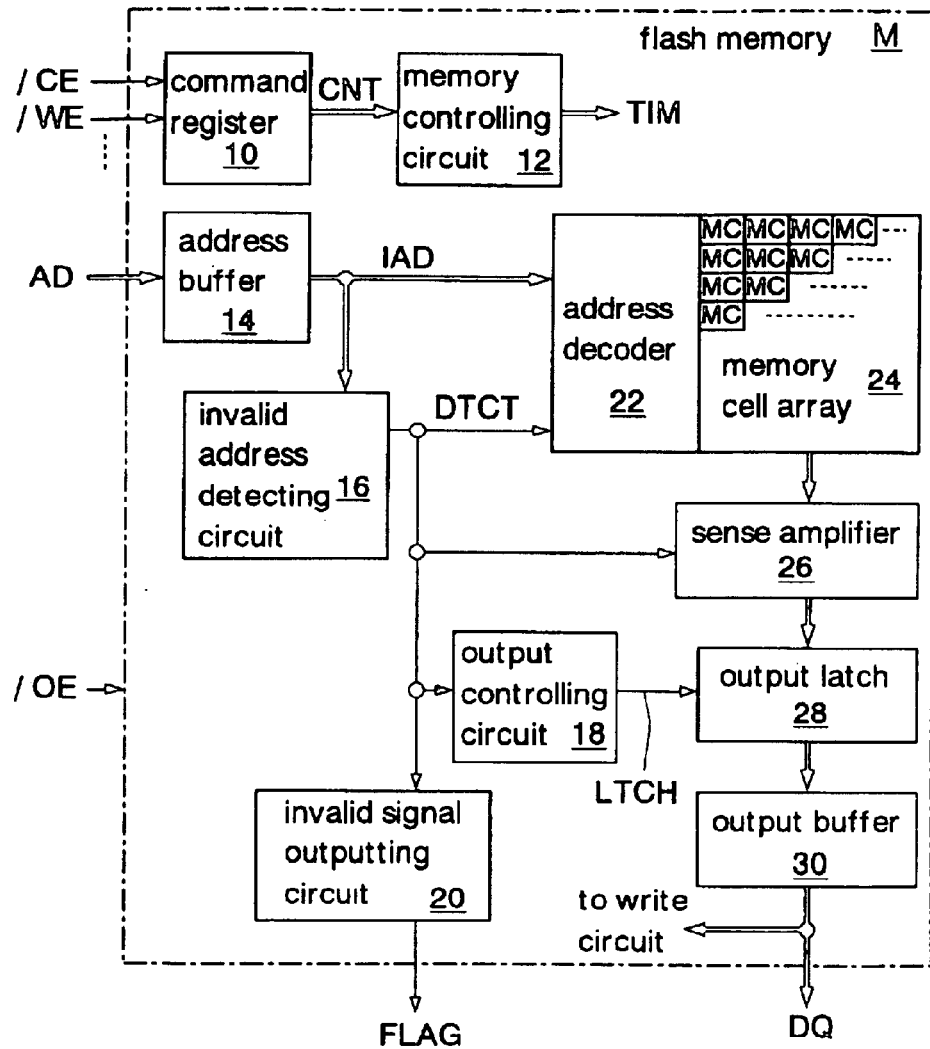
FIG. 1 is a block diagram showing the first embodiment of a semiconductor integrated circuit in the present invention.

FIG. 1 shows the first embodiment of a semiconductor memory device and a method of controlling the semiconductor memory device according to the present invention. Hereinafter, signals supplied through terminals have the same reference codes as those of the terminals, such as an "address signal AD" and an "address terminal AD". In some cases, signal names are omitted, such as the "AD signal" meaning the "address signal AD". Signals having "/" in their names are signals of negative logic. Signal lines shown by bold solid lines in the drawings indicate signal lines comprising a plurality of lines. Some blocks to which the bold solid lines are connected comprise a plurality of circuits.

The semiconductor memory device according to this embodiment comprises 22 address terminals AD and 16 data input/output terminals DQ (I/O=16 bits), and formed as a flash memory M of 48M bits. In other words, the flash memory M has an address space of 3M bits.

Figure 2:
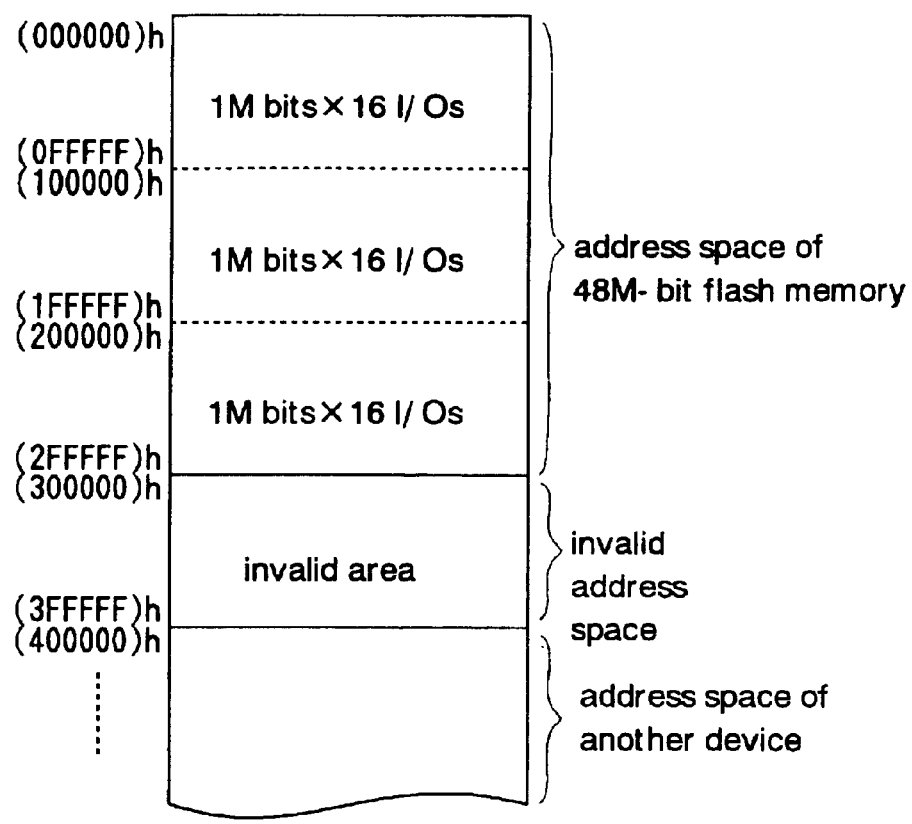
FIG. 2 is an address map of a system unit mounting the semiconductor integrated circuit according to the first embodiment.

FIG. 2 shows an example of an address map of a system unit mounting the flash memory M. The system unit assigns (000000)h to (2FFFFF)h to the address space of the flash memory M. The suffix "h" means that each address is hexadecimal. An address space from (300000)h to (3FFFFF)h is an invalid area. An address space starting from (400000)h is assigned to another device such as an SRAM.

As shown in FIG. 1, the flash memory M comprises a command register 10, a memory controlling circuit 12, an address buffer 14, an invalid address detecting circuit 16, an output controlling circuit 18, an invalid signal outputting circuit 20, an address decoder 22, a memory cell array 24, a sense amplifier 26, and an output latch 28 and an output buffer 30 both of which are output circuits.

The command register 10 receives a signal such as a chip enable signal/CE or a write enable signal/WE as an input command, and outputs a controlling signal CNT corresponding to the input command. The memory controlling circuit 12 receives the controlling signal CNT and outputs a timing signal TIM or the like controlling an operation of the chip. The memory controlling circuit 12 includes a write controlling circuit, a read controlling circuit, and an erase controlling circuit.

The address buffer 14 receives the address signal AD and outputs the received signal as an internal address signal IAD. The invalid address detecting circuit 16 receives the IAD signal and outputs an invalid address detecting signal DTCT. The DTCT signal is activated only in the case where no memory cell corresponding to the IAD signal exists.

The output controlling circuit 18 receives the DTCT signal and outputs a latch signal LTCH. The LTCH signal is activated when the DTCT signal is inactivated (at L level), and inactivated when the DTCT signal is activated (at H level). The invalid signal outputting circuit 20 outputs an invalid signal FLAG indicating a fact that the AD signal having been supplied indicates an address other than the address space (invalid address), when the DTCT signal is activated (at H level).

The address decoder 22 is activated by the DTCT signal of L level and outputs a decoding signal (not shown) corresponding to the IAD signal to the memory cell array 24. The address decoder 22 comprises a row address decoder and a column address decoder both of which are not shown. A word line is selected by the row address decoder and a column select line is selected by the column address decoder. The word line and the column select line select one of memory cells MC laid out vertically and horizontally in the memory cell array 24, and a read, write, or erase operation is carried out.

The sense amplifier 26 is activated by receiving the DTCT signal of L level in a read operation. The sense amplifier 26 amplifies read data from the memory cell MC transmitted through a bit line (not shown), and transmits the amplified data to the output latch 28.

The output latch 28 receives the read data from the sense amplifier 26 in synchronization with the LTCH signal, and outputs the data having been received. The output buffer 30 outputs the read data from the output latch 28 as a data input/output signal DQ when an output enable signal/OE is activated (at L level).

An operation of the flash memory M will be explained next. In general, a read operation in the flash memory M is carried out by receiving a random address signal, while a write operation and an erase operation therein are carried out by specifying a block having predetermined bytes with a command input. In this embodiment, the read operation is explained in detail. The write and erase operations will be explained in detail later in the third embodiment.

Figure 3:
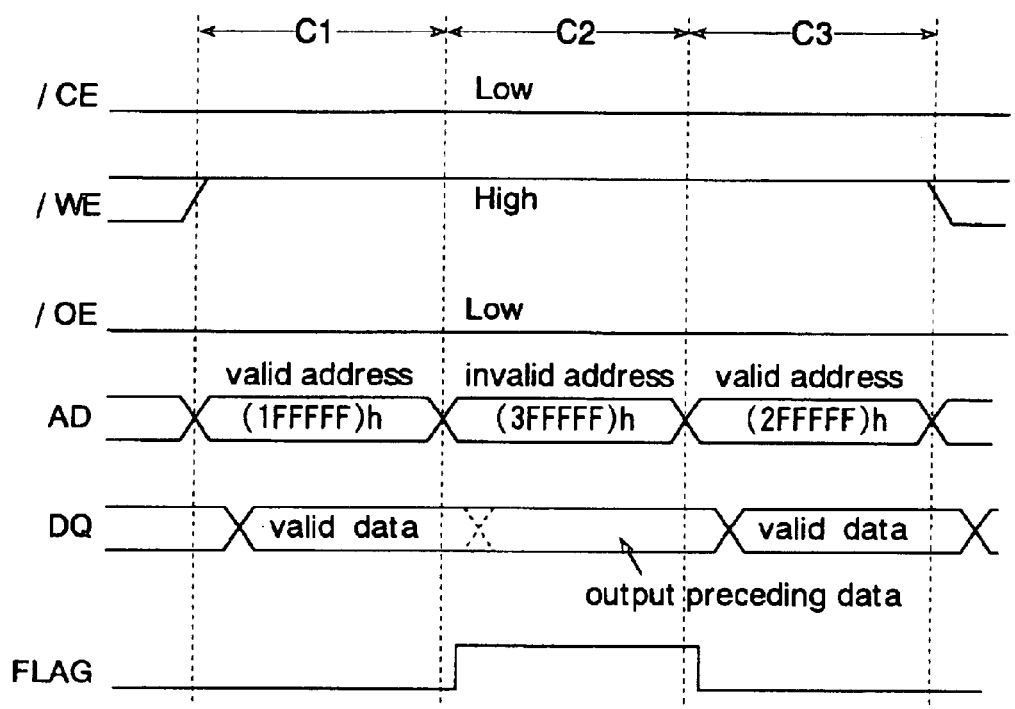
FIG. 3 is a timing chart showing a read operation in the semiconductor integrated circuit according to the first embodiment.

FIG. 3 shows the read operation in a state where the/CE and/OE signals are fixed at L level while the/WE signal is fixed at H level.

In an operation cycle C1, an address (1FFFFF)h is supplied to the flash memory M. The invalid address detecting circuit 16 shown in FIG. 1 judges the received IAD signal to be valid and outputs the DTCT signal of L level. By receiving the DTCT signal, the address decoder 22 and the sense amplifier 26 are activated and the output controlling circuit 18 activates the LTCH signal. Data read from one of the memory cells MC are received by the output latch 28, and output from the output buffer 30 as the DQ data (valid data).

In a succeeding operation cycle C2, an address (3FFFFF)h is supplied to the flash memory M. This address is not supplied intentionally by the system unit mounting the flash memory M but generated by power supply noise, crosstalk, or the like. In reality, the system unit outputs an address signal (2FFFFF)h, for example.

The invalid address detecting circuit 16 judges the received IAD signal to be invalid and outputs the DTCT signal of H level. The address decoder 22 and the sense amplifier 26 are inactivated by receiving the DTCT signal. In other words, in the case where the invalid address signal has been received, memory cell selection is prohibited and the read operation is not carried out. The output controlling circuit 18 receives the DTCT signal and retains the inactive state of the LTCH signal. Therefore, the output latch 28 does not receive uncertain data from the sense amplifier 26 having been inactivated. The read data having been received in the immediately preceding read operation are continuously output from the data terminals DQ. At this time, power consumption can be reduced, since the internal circuits such as the address decoder 22 and the sense amplifier 26 do not operate. Furthermore, since the state (voltage) of each of the DQ terminals does not change, a current flowing in the data bus in the system unit is reduced, which leads to further reduction in power consumption.

The invalid signal outputting circuit 20 activates the FLAG signal (causes the FLAG signal to be at H level) by receiving the DTCT signal. In other words, the fact that the address signal AD having been supplied indicates an invalid address space is transmitted to the system unit. The system unit carries out an error procedure for example, by receiving the FLAG signal. Therefore, a malfunctioning of the system unit is prevented by the FLAG signal.

In a next operation cycle C3, by receiving the FLAG signal of H level, the system unit supplies the address (2FFFFF)h again to the flash memory M and carries out the read operation. The DTCT signal is changed to L level by the valid address signal AD. By receiving this change, the FLAG signal changes to L level and valid read data are output from the DQ terminals.

In the case where the invalid address in the cycle C2 has been generated due to an erroneous program in the system unit, the flash memory M receives the invalid address (3FFFFF)h in the cycle C3, and causes the FLAG signal to be at H level. At this time, the system unit can recognize that the invalid address has been generated by a reason other than noise, by detecting the FLAG signal for a plurality of times.

As has been described above, according to the semiconductor memory device and the controlling method thereof, the invalid signal FLAG is output to the exterior in the case of detection of the fact that the address signal supplied from the exterior in an operation cycle does not correspond to the address space. Therefore, a system unit mounting the flash memory M having the address space larger than $2^n$ and smaller. than $2^{(n+1)}$ can easily recognize the invalid address signal having been supplied to the flash memory M. As a result, a malfunctioning can be prevented and reliability of the system unit can be improved.

In the case where the invalid address has been detected, the read data having been received in the output latch 28 are continuously output. Therefore, the power consumption is reduced, since the signal levels of the data terminals do not change at the time of invalid address supply.

Moreover, the system unit mounting the flash memory M can recognize the fact that the invalid address has been supplied to the flash memory M, by detecting the fact that the data signal read continuously does not change.

Figure 4:
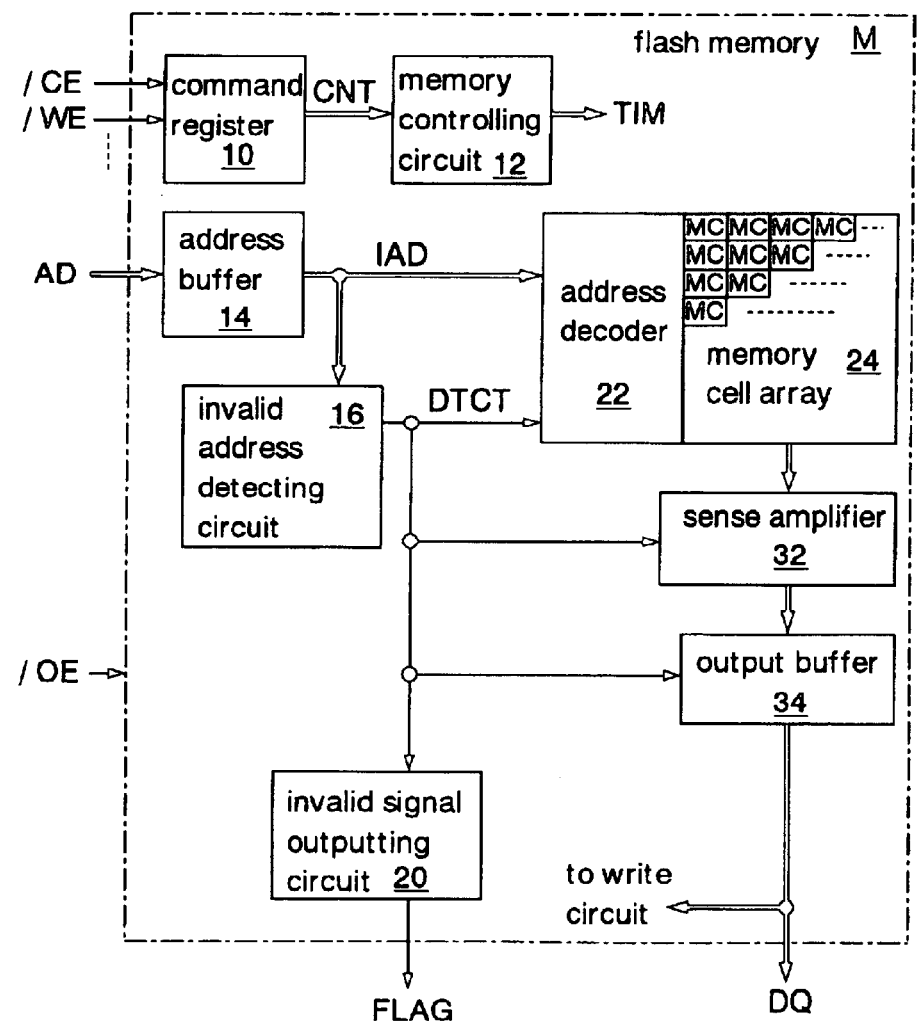
FIG. 4 is a block diagram showing the second embodiment of the semiconductor integrated circuit in the present invention.

FIG. 4 shows the semiconductor memory device and the controlling method thereof according to the second embodiment of the present invention. The circuits and the signals which are the same as in the first embodiment have the same reference codes and detailed explanation thereof is omitted.

The semiconductor memory device according to this embodiment is formed as the flash memory M having the same address space as in the first embodiment. In other words, the flash memory M has the address space of 3M bits.

A sense amplifier 32 and an output buffer 34 of the flash memory M in this embodiment are different from those in the first embodiment. The output controlling circuit 18 and the output latch 28 in the first embodiment do not exist in the second embodiment. Other configurations are the same as the configurations of the first embodiment.

The sense amplifier 32 has a function of receiving read data. The sense amplifier 32 is inactivated by receiving the DTCT signal of H level. The output buffer 34 causes the DQ terminals to be in a high-impedance state regardless of a state of the/OE signal, whenever the output buffer 34 receives the DTCT signal of H level.

Figure 5:
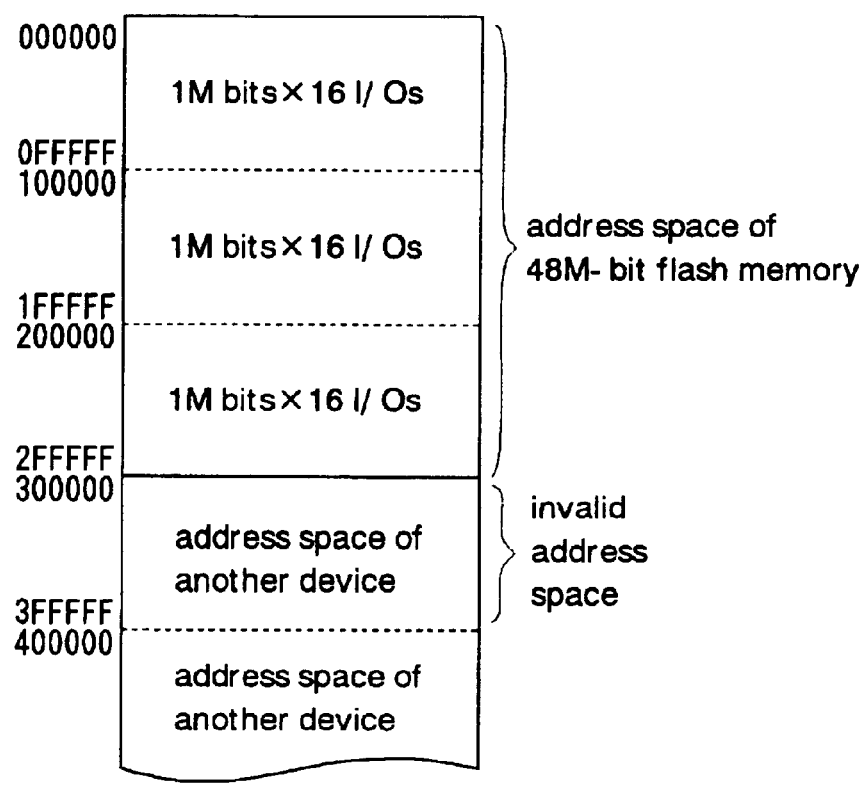
FIG. 5 is a an address map of a system unit mounting the semiconductor integrated circuit according to the second embodiment.

FIG. 5 shows an example of an address map of a system unit mounting the flash memory M. The system unit assigns the address space from (000000)h to (2FFFFF)h to the flash memory M, as done in the first embodiment. The address space from (300000)h to (3FFFFF)h which is an invalid address space for the flash memory M and the address space starting from (400000)h are assigned to other devices such as an SRAM.

Figure 6:
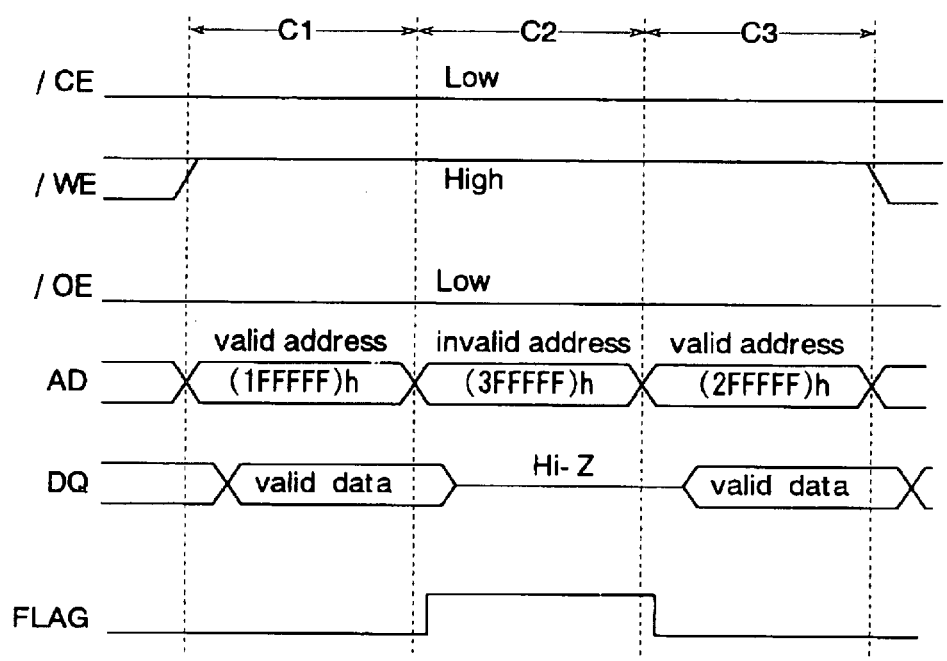
FIG. 6 is a timing chart showing a read operation in the semiconductor integrated circuit according to the second embodiment.

FIG. 6 shows an operation of the flash memory M described above. The flash memory M in this embodiment inactivates the output buffer 34 and causes the DQ terminals to have high impedance (Hi-Z) when the flash memory M receives an invalid address signal operations other than the above are the same as in the first embodiment.

In this embodiment, the same effect as in the first embodiment can be obtained. Furthermore, the DQ terminals have high impedance in the case where the invalid address has been supplied. Therefore, the current flowing in the data bus in the system unit can be reduced and the power consumption is also reduced. Moreover, since the invalid address space of the flash memory M can be assigned to another device, the address spaces of the system unit can be used without waste, which leads to efficient use of the address spaces.

Figure 7:
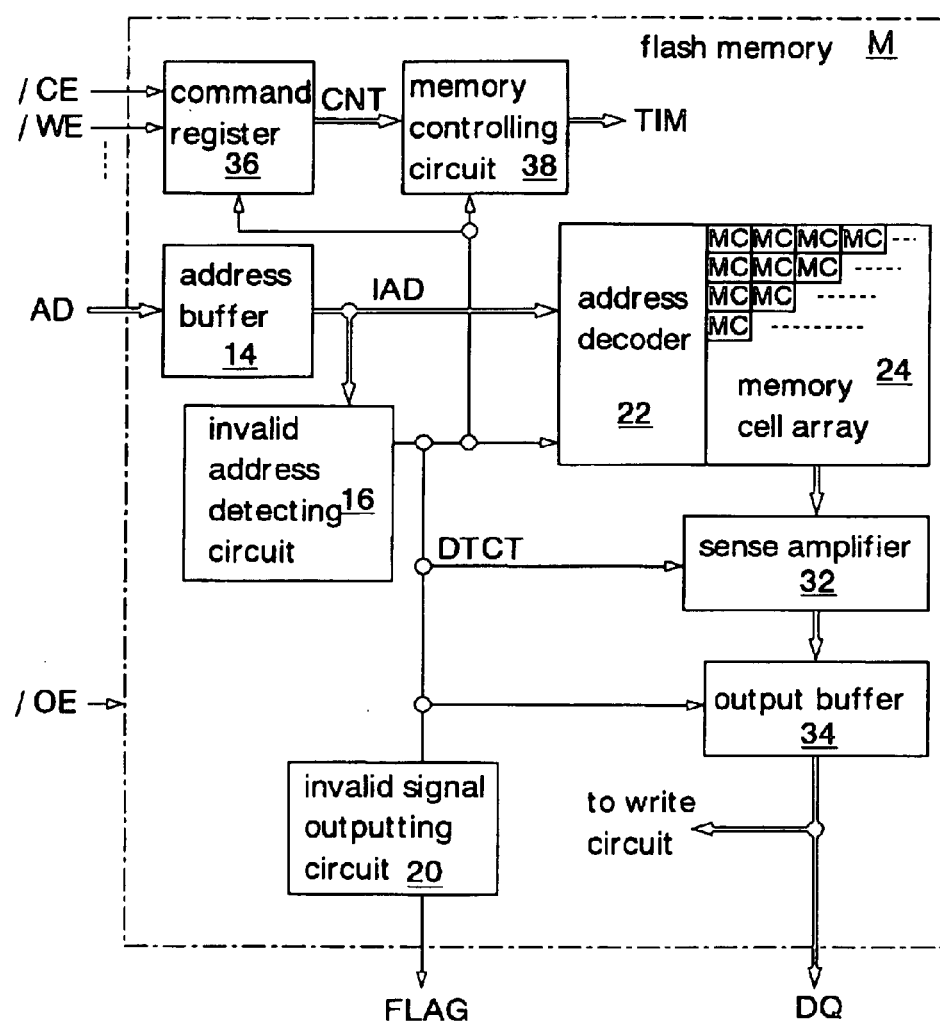
FIG. 7 is a block diagram showing the third embodiment of the semiconductor integrated circuit in the present invention.

FIG. 7 shows the semiconductor memory device and the controlling method thereof according to the third embodiment of the present invention. The circuits and the signals, which are the same as in the first and the second embodiments, have the same reference codes and detailed explanation thereof is omitted.

The semiconductor memory device in this embodiment is formed as the flash memory M having the same address space as was in the first embodiment. In other words, the flash memory M has the 3M-bit address space.

In this embodiment, a command register 36 and a memory controlling circuit 38 are controlled by the DTCT signal. Other configurations are the same as in the second embodiment.

Figure 8:
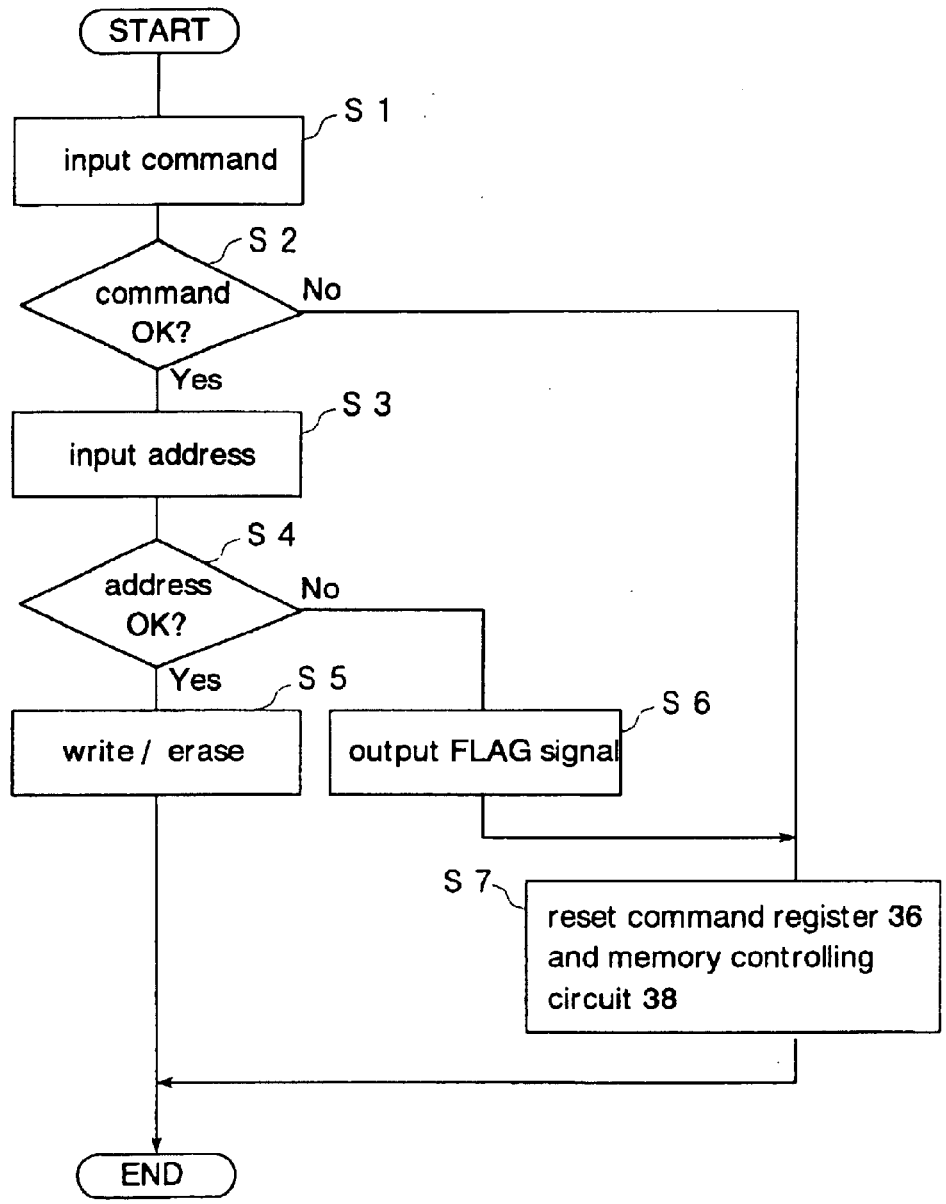
FIG. 8 is a control flow showing command input processing in the semiconductor integrated circuit according to the third embodiment.

FIG. 8 shows a control flow of command input processing in a write operation and an erase operation in the flash memory M.

In step S1, the/CE signal or the/WE signal or the like is input as a command.

In Step S2, the command register 36 shown in FIG. 7 judges whether or not the command received is correct. When the command having been received is correct, the procedure goes to Step S3. When the command received is wrong, the procedure goes to Step S7.

In Step S3, a write address or an erase address is input.

In Step S4, the invalid address detecting circuit 16 judges whether or not the address signal having been received is valid. When the address having been received is valid, the procedure goes to Step S5. When the address having been received is not valid, the invalid address detecting circuit 16 outputs the DTCT signal of H level. The procedure then goes to Step S6.

In Step S5, the flash memory M automatically carries out the write or erase operation internally, in response to the command having been received. Thereafter, the flash memory M waits for a command input.

Meanwhile, in Step S6, the invalid signal outputting circuit 20 shown in FIG. 7 changes the FLAG signal to H level, by receiving the DTCT signal of H level. The procedure then goes to Step S7.

In Step S7, the command register 36 and the memory controlling circuit 38 are reset by receiving the DTCT signal of H level, and invalidate the command received in Step S1. Therefore, the flash memory M does not carry out the write or erase operation. Thereafter, the flash memory M waits for a command input.

A read operation in this embodiment is carried out as in the second embodiment.

In this embodiment, the same effect as in the first embodiment can be obtained. Furthermore, in this embodiment, the command register 36 and the memory controlling circuit 38 are reset at the time of invalid address supply. Therefore, write and erase operations in an invalid address space are prevented. As a result, reliability of the system unit mounting the flash memory can be improved. Moreover, the power consumption can be reduced, since the internal circuits do not operate at the time of invalid address supply.

In the embodiments described above, the present invention has been applied to the flash memory M having the data input/output terminals DQ. However, the present invention is not restricted to such an aspect of performance, and may be applied to a flash memory having input terminals and output terminals respectively.

In the embodiments described above, the present invention has been applied to the flash memory. However, the present invention is not restricted to such an aspect of performance, and may be applied to EPROMs, DRAMs, or SRAMs, for example. In this case, the first embodiment in which the data signal received in an immediately preceding cycle is continuously output at the time of invalid address supply leads to a greater effect when applied to an EPROM carrying out read operations continuously.

In the first and the second embodiments described above, the read operations are carried out continuously. However, the present invention is not limited to this example, and the same effect can be obtained when the invalid signal FLAG is output at the time of invalid address supply in a write operation or a read operation after a write operation.

The invention is not limited to the above embodiments and various modifications may be made without departing from the spirit and the scope of the invention. Any improvement may be made in part or all of the components.

What is claimed is:

1. A semiconductor memory device comprising:
    a plurality of memory cells corresponding to an address space larger than $2^n$ and smaller than $2^{(n+1)}$, where n is a positive integer;
    an invalid address detecting circuit detecting that an address signal supplied from exterior indicates an address space other than said address space;
    an invalid signal outputting circuit outputting an invalid signal via a dedicated terminal to the exterior of the semiconductor memory device when said invalid address detecting circuit carries out said detection;
    a latch circuit latching read data read from said memory cells in each read operation; and
    an output controlling circuit outputting, without accessing said memory cells, the read data latched in said latch circuit by the preceding read operation, when said invalid address detecting circuit carries out said detection in a read operation.

2. A semiconductor memory device comprising:
    a plurality of memory cells corresponding to an address space larger than $2^n$ and smaller than $2^{(n+1)}$, where n is a positive integer;
    an invalid address detecting circuit detecting that an address signal supplied from exterior indicates an address space other than said address space;
    a latch circuit latching read data read from said memory cells in each read operation; and
    an output controlling circuit outputting, without accessing said memory cells, the read data latched in said latch circuit by the preceding read operation, when said invalid address detecting circuit carries out said detection in a read operation.

3. A semiconductor memory device according to claim 1, further comprising:
    a command controlling circuit carrying out a write or an erase operation in said memory cells in response to a command input from the exterior, wherein
    said command controlling circuit invalidates said command input to thereby prohibit the write or the erase operation, when the invalid address detecting circuit detects that the address signal supplied from exterior as the command input indicates the address space other than the said address space.

4. A method of controlling a semiconductor memory device comprising a plurality of memory cells corresponding to an address space larger than $2^n$ and smaller than $2^{(n+1)}$, where n is a positive integer, said method comprising the steps of:
    latching read data read from said memory cells in each read operation; and
    outputting an invalid signal via a dedicated terminal to the exterior of the semiconductor memory device, and outputting, without accessing said memory cells, the read data latched by the preceding read operation, when an address signal supplied from the exterior indicating an address space other than said address space has been detected.

5. A method of controlling a semiconductor memory device according to claim 4, further comprising the steps of:
    automatically carrying out a write or an erase operation in said memory cells in response to a command input from the exterior
    invalidating the command input thereby prohibiting the write or the erase operation, when the address signal supplied from the exterior indicating the address space other than the said address space has been detected.

6. A semiconductor memory device according to claim 1, further comprising:
    a decoder which decodes said address signal, and is inactivated when said invalid address detecting circuit carries out said detection.

7. A semiconductor memory device according to claim 1, further comprising:
    a sense amplifier which amplifies a data signal read from the memory cells, and is inactivated when said invalid address detecting circuit carries out said detection.

* * * * *